United States Patent [19]

Howard et al.

[11] Patent Number: 5,173,696
[45] Date of Patent: Dec. 22, 1992

[54] CONTROL CIRCUITRY USING ELECTRONIC EMULATION OF A SYNCHRO SIGNAL FOR ACCURATE CONTROL OF POSITION AND RATE OF ROTATION FOR SHAFTS

[75] Inventors: David E. Howard, Hazel Green; Dennis A. Smith, Athens, both of Ala.

[73] Assignee: The United States of America as represented by the Adminstrator of the National Aeronautics and Space Administration, Washington, D.C.

[21] Appl. No.: 710,192

[22] Filed: Jun. 3, 1991

[51] Int. Cl.[5] .............................................. H03M 1/48
[52] U.S. Cl. .................................. 341/117; 341/114; 318/654
[58] Field of Search ............... 341/111, 112, 113, 114, 341/115, 116, 117; 318/654, 661, 668, 632; 328/133, 134

[56] References Cited

U.S. PATENT DOCUMENTS

| | | | |
|---|---|---|---|
| 4,075,698 | 2/1978 | Lode | 341/112 |
| 4,204,257 | 5/1980 | Hungerford | 364/474 |
| 4,857,926 | 8/1989 | Neglia et al. | 341/116 |
| 4,933,674 | 6/1990 | Gasperi et al. | 341/116 |

Primary Examiner—Howard L. Williams
Assistant Examiner—B. K. Young
Attorney, Agent, or Firm—Robert L. Broad, Jr.; Guy M. Miller; John R. Manning

[57] ABSTRACT

The invention herein disclosed is a digital circuit which emulates a synchro signal in a synchro-resolver follower system for precise control of shaft position and rotation at very low rotational rates. The subject invention replaces the synchro and drive motor in a synchro-resolver follower system with a digital and analog synchro emulation circuit for generating the resolver control signal. The synchro emulation circuit includes amplitude modulation means to provide relatively high frequency resolver excitation signals for accurate resolver response even with very low shaft rotation rates.

14 Claims, 2 Drawing Sheets

CONTROL CIRCUITRY USING ELECTRONIC EMULATION OF A SYNCHRO SIGNAL FOR ACCURATE CONTROL OF POSITION AND RATE OF ROTATION FOR SHAFTS

ORIGIN OF THE INVENTION

The invention described herein was made by employees of the U.S. Government and may be manufactured and used by or for the Government for Government purposes without the payment of any royalties thereon or therefore.

TECHNICAL FIELD

The present invention is broadly related to servo mechanisms and control systems for accurate control of rotating shaft position and rate of rotation. More specifically, this invention is related to feedback control systems which typically include a synchro, a resolver and a controlled motor. The invention disclosed herein is directed particularly to a digital circuit which emulates a synchro signal in a synchro-resolver follower system.

BACKGROUND ART

Synchro-resolver systems or devices are typically employed to sense and control the position of rotating shafts accurately. In older prior art synchro-resolver systems, a motor is employed to drive a synchro at a particular rate or rotational velocity. The synchro produces a control signal which is fed into a resolver. The output of the resolver is then fed to a demodulator which produces an error signal that is input to an amplifier which drives the motor to be controlled.

The disadvantages of the previous methods are the cost, weight and corresponding electrical and mechanical hardware requirements for the additional drive motor and synchro. In addition, conventional resolver shaft position controlling circuits cannot be employed at very low speeds because the resolver must be excited by sine and cosine waveforms of fairly high frequency in order to function properly.

There have been attempts to overcome the limitations of conventional electro-mechanical synchros with the substitution of analog circuit synchro signal generators. An analog emulation of this synchro signal is undesirable, however, due to the instabilities of signals produced in analog circuitry.

Other prior art resolver excitation circuits have included digital circuit elements. For example, U.S. Pat. No. 4,204,257 discloses a resolver position measuring device which includes a digital counter, a pair of read only memory means for providing sine and cosine sequences and a pair of digital to analog converters to generate sine and cosine analog waveforms for resolver excitation. Circuits such as this do not solve the problem of poor resolver low frequency response.

DISCLOSURE OF INVENTION

The object of the present invention is to provide a digital and analog control circuit, for generating modulated analog resolver excitation signals and recovering an error signal from a resolver, having the advantageous circuit topology herein disclosed.

The subject invention replaces the synchro and drive motor with a synchro emulation circuit for generating the resolver excitation signal. The synchro emulation circuit includes a clock oscillator which controls the operation of a counter. The output of the counter is used for addressing a pair of read only memories (ROMs), a first ROM which contains digitized sine information and a second ROM which contains digitized cosine information. As the counter increments or decrements, information is passed from the ROMs to a corresponding pair of digital to analog (D/A) converters which in turn provide corresponding analog cosine and sine wave outputs. These waveforms are each multiplied with a carrier frequency and then used as an excitation signal for a corresponding resolver stator input.

A frequency divider and multiplexer circuit is employed between the crystal clock oscillator and the counter to enable the counter frequency to be chosen from a plurality of frequencies to allow a desired rotational rate to be selected.

The present invention solves the problem of poor resolver low frequency response by multiplying the low frequency sine and cosine waves with a high frequency carrier signal and then applying the resulting modulated signals to the respective resolver stator inputs. The signal generated by the resolver rotor is then demodulated to obtain an error signal which is input to a power amplifier for a controlled motor, to maintain the shaft at a desired rotational velocity and position. By employing a plurality of these resolver circuits, all controlled by the same oscillator, the speeds and relative positions of a plurality of shafts can be accurately controlled.

BRIEF DESCRIPTION OF THE DRAWINGS

The objects, features, and advantages of the present invention will become apparent from a consideration of the following detailed description of a preferred embodiment thereof, taken in conjunction with the accompanying drawings, in which.

BEST MODE FOR CARRYING OUT THE INVENTION

Figure 1:
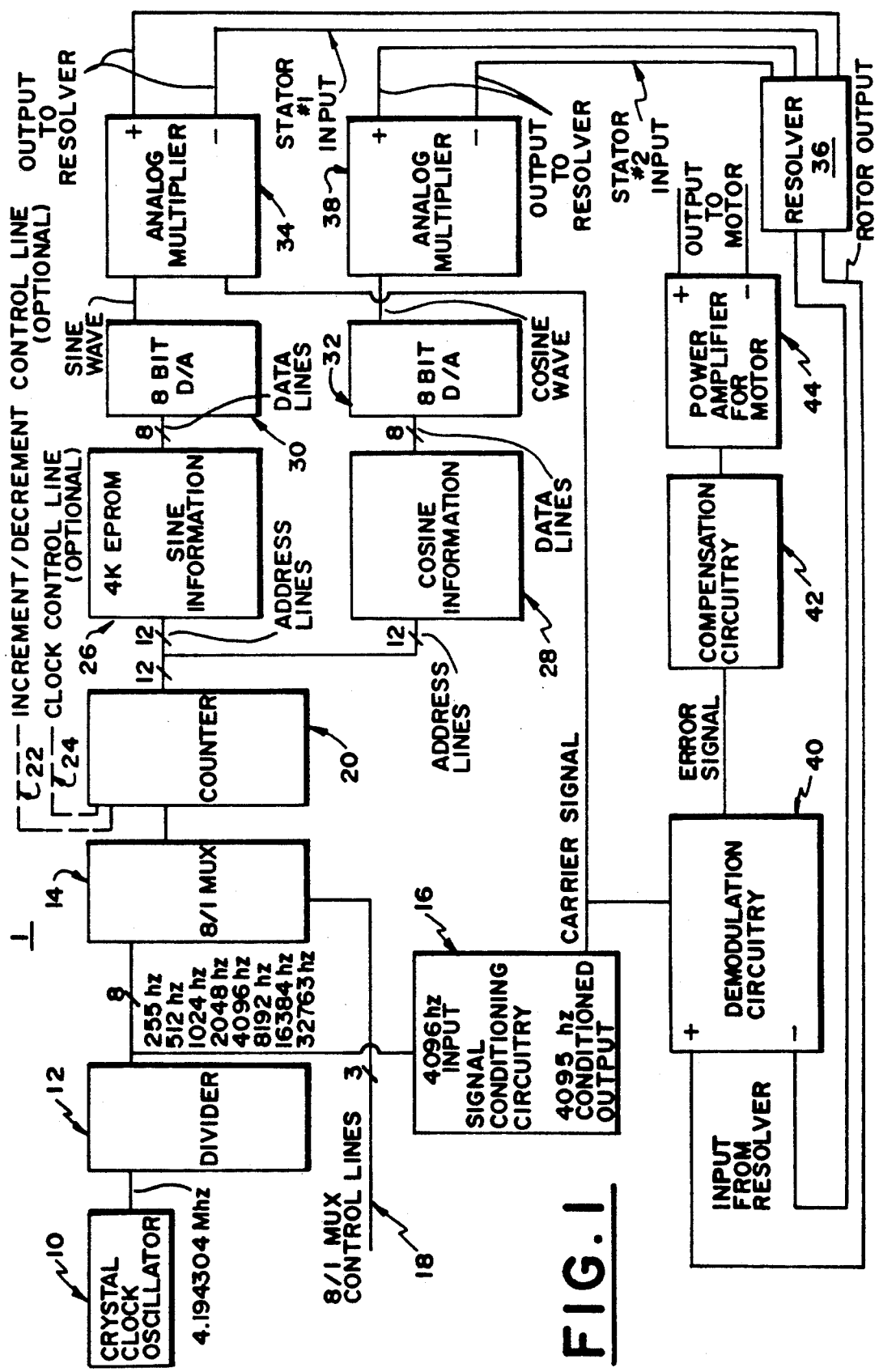
FIG. 1 is a block diagram of a circuit that forms a preferred embodiment of the subject invention; and, FIG. 2 is a schematic diagram of a portion of the circuit illustrated in FIG. 1.
Figure 2:
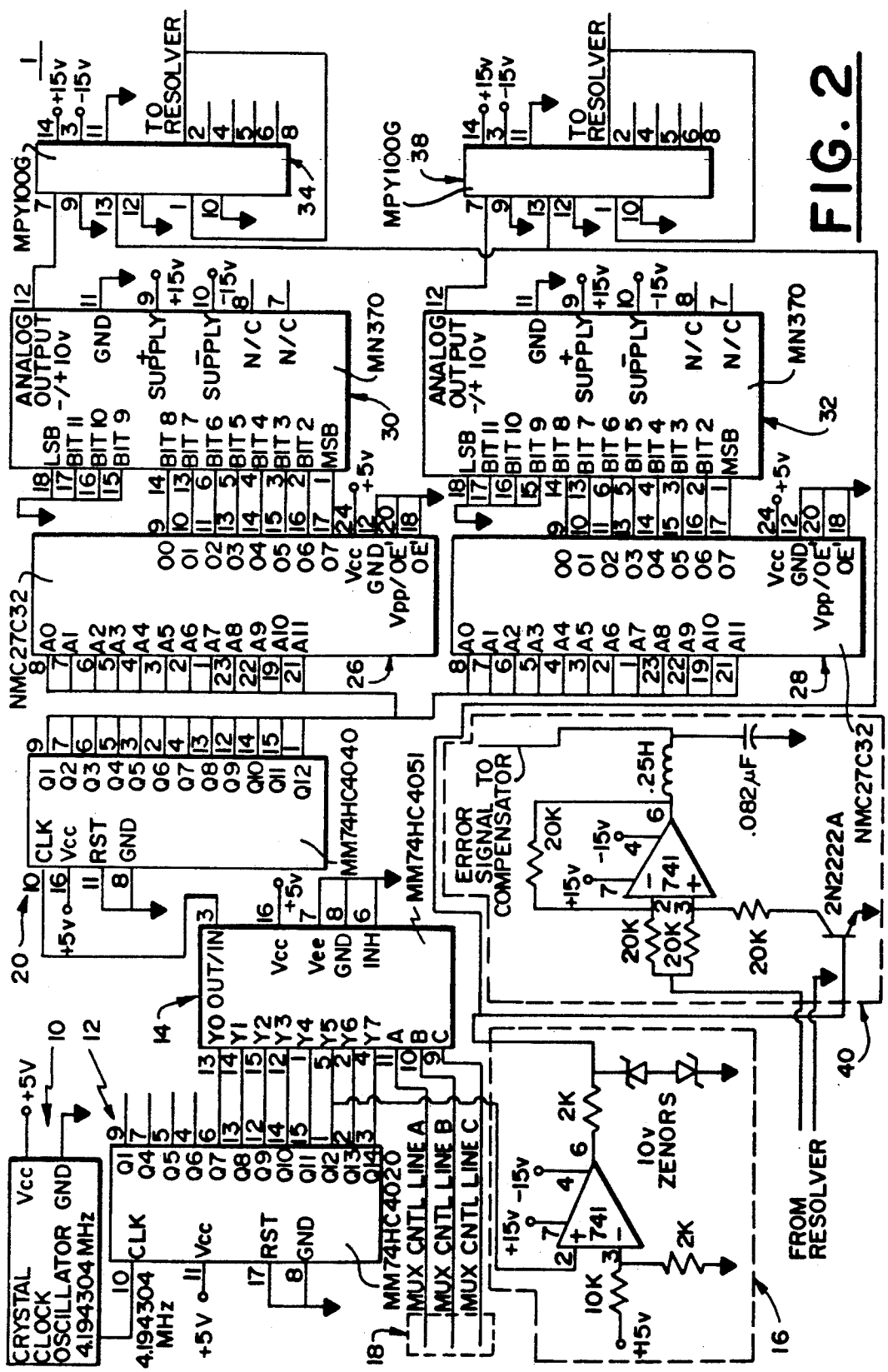

Turning now to a more detailed consideration of a preferred embodiment of the present invention, there is illustrated in FIGS. 1 and 2, a synchro emulation circuit 1 including a single crystal clock oscillator 10 which provides a periodic signal to a frequency divider 12. In the preferred embodiment, the crystal clock oscillator provides a 4.194304 Megahertz (MHz) signal which is divided down to a 4.096 kilohertz (KHz) carrier signal. The 4.096 KHz signal is conditioned to provide a stable −10 volt to +10 volt output. In the preferred embodiment, the frequency divider 12 is capable of providing 8 separate frequencies in output, they are: 256 Hz, 512 Hz, 1024 HZ, 2048 Hz, 4096 Hz, 8192 Hz, 16384 Hz and 32768 Hz.

The output of the frequency divider 12 is input to a multiplexer 14 and signal conditioning circuitry 16. The 8 to 1 multiplexer chooses one of the 8 frequencies available on the frequency divider in response to control signals from a trio of multiplexer control lines 18. The signal conditioning circuitry 16 provides a conditioned 4.096 KHz output signal as a carrier signal.

The multiplexer provides a selected frequency as an input to counter 20. The counter output may optionally either increment or decrement in response to a counter control signal on the counter control line 22. The counter may also be stopped at a given count by the addition of an optional switched clock control line 24. Counter functions such as increment, decrement and stop are not shown in the embodiment of FIG. 2, but these functions are easily added with currently available integrated circuits. The output from the counter is provided as an input to a sine information ROM 26 and a cosine information ROM 28. The output from the sine information ROM is provided as an input to a first D/A converter 30. The output of the cosine information ROM is provided as an input to a second D/A converter 32.

The analog output from the first D/A converter 30 is a sine wave which is fed into a first analog multiplier 34. A second input to the first analog multiplier 34 is the conditioned carrier signal output from the signal conditioning circuitry 16. The first analog multiplier 34 multiplies the analog sine wave output from the first D/A converter and the 4.096 KHz carrier signal to provide a first output signal to a resolver 36, or to an equivalent position sensing device. The first multiplier output signal to the resolver input is:

sine (carrier) * sine (selected frequency)

The "sine (carrier)" term in this expression represents a conditioned carrier which can be a sine wave or any other periodic signal. In one embodiment a square wave is the carrier, however the carrier could be a triangular wave or a sawtooth wave.

The output of the second D/A converter 32 is a cosine wave which is provided as an input to a second analog multiplier 38. The second analog multiplier 38 has as a second input the 4.096 KHz conditioned output of the signal conditioning circuit 16. The analog multiplier multiplies the cosine waveform and the conditioned carrier signal to generate the second resolver input signal, which is:

sine (carrier) * cosine (selected frequency)

As mentioned above the "sine (carrier)" term may be a sine wave, a square wave, a triangular wave or a sawtooth wave. The only limitation is that the carrier must be a periodic waveform. The second resolver input must use the same conditioned carrier signal as the first resolver input, i.e. a square wave conditioned carrier signal may be used for both multiplier inputs. For this implementation, the selected shaft rotation frequencies can be: 1/16 Hz, ⅛ Hz, ¼ Hz, ½ Hz, 1 Hz, 2 Hz, 4 Hz and 8 Hz.

A demodulation circuit 40 receives an input signal from the resolver 36, or from the equivalent sensing device. The demodulation circuit 40 combines this input with the output of the signal conditioning circuit 16 for coherent amplitude demodulation of the error signal. The demodulation circuit 40 produces an error signal which is then provided as an input to a compensation circuit 42. The compensated output signal from the compensation circuit 42 is an input to a power amplifier 44 for a controlled motor.

As illustrated in FIG. 2, the various circuit elements of the synchro emulation circuit 1 can be chosen as indicated by the following table:

| ELEMENT NUMBER | IC IDENTIFICATION NUMBER |
|---|---|
| 12 | MM74HC4020 |
| 14 | MM74HC4051 |
| 16 | 741 OP AMP and associated circuit elements |
| 20 | MM74HC4040 |
| 26, 28 | NMC27C32 |

| ELEMENT NUMBER | IC IDENTIFICATION NUMBER |
|---|---|
| 30, 32 | MN370 |
| 34, 38 | MPY 100G |
| 40 | 741 OP AMP and associated circuit elements |

Turning now to operational details, the 4.194304 MHz clock 10 provides an input to the divider 12 and multiplexer 14 which gives 8 selectable outputs of binary multiples from 256 Hz through 32768 Hz. The divider 12 also provides the 4096 Hz carrier signal.

As shown in FIG. 2, the MM74HC4020 divider 12 provides the 4096 Hz signal in a 0-5 volt waveform. Conditioning circuit 16 converts this to a −10 V to +10 V conditioned carrier signal.

The selectable frequencies are used to vary the rotational rate of the motor being controlled. The selected frequency is input to the 12 bit counter 20. The output of this counter is used for addressing the sine ROM 26 and the cosine ROM 28. The sine ROM contains digitized sine information and the cosine ROM contains digitized cosine information. As the counter 20 increments (or, for another counter, not the 74HC4040, decrements), information is passed from each of the ROMs to first and second D/A converters 30 and 32, respectively. The outputs from the D/A converters are a sine waveform and a cosine waveform, each oscillating at a frequency corresponding to the desired shaft rotational rate The sine and cosine waves are each multiplied with (or amplitude modulated by) the carrier frequency in the analog multiplier circuits 34 and 38. These multiplied signals are used as excitation signals for the resolver 36. These signals are similar to what would be provided by a synchro in a standard synchro-resolver follower application. However, since the excitation signals are amplitude modulated up into the kilohertz frequency range, problems with resolver low frequency response are avoided and a typical resolver may be employed for applications in which very slow shaft rotation rates are desired. The excitation signals, modulated in this way, contain both position and rate of rotation commands. When the first and second stator inputs of the resolver 36 are excited with these modulated signals, the resolver stator output signal needs only to be demodulated to generate a true error signal. The purpose of the resolver 36 is to convert the excitation signals into an error signal.

The output of the resolver 36 is demodulated from the carrier frequency in the demodulation circuit 40 to provide the error signal used in controlling the motor. FIG. 2 shows a simple circuit for coherent amplitude demodulation as is well known in the art. The error signal is the difference between the desired rotational position and the actual rotational position of the motor.

The disclosed embodiment should not be interpreted as limiting the present invention. There are a number of alternate embodiments which could be realized within the scope and spirit of the invention. For example, the frequency of the crystal controlled oscillator can be adjustable or the oscillator can be replaced with a voltage controlled oscillator, to give a wider dynamic range for commanded rotational rates. In addition, a stationary position of the motor can easily be realized by withholding or stopping the clock to the counter at a count corresponding to the desired angular position. In addition, increased accuracy and resolution for this controller could be realized by increasing the size of the ROM storage means, thereby allowing enhanced resolution of the digitized sine and cosine information. The present embodiment could also be altered to provide increased accuracy by utilizing higher resolution D/A converters. Any such modification simply requires the number of data lines from the ROM means to be equal to the number of input lines for the D/A converters. Finally, the direction of rotation could be selectable by replacing the 12 bit counter 20 with a 12 bit up/down counter and providing a means for controlling the counter.

Although the invention has been disclosed in terms of a preferred embodiment, it should be understood that numerous modifications and variations could be made thereto without departing from the true spirit and scope thereof as defined by the following claims.

We claim:

1. A control circuit for generating excitation signals for a resolver and recovering an error signal from the resolver, comprising:
   a) periodic digital signal generation means, for generating a first digital signal and a carrier signal;
   b) counter means responsive to said first digital signal for generating a counter output signal;
   c) first means responsive to said counter output signal for generating a digital sine wave signal which is a function of said counter output signal;
   d) second means responsive to said counter output signal for generating a digital cosine wave signal which is a function of said counter output signal;
   e) first digital-to-analog conversion means responsive to said digital sine wave signal for generating an analog sine wave signal;
   f) second digital-to-analog conversion means responsive to said digital cosine wave signal for generating an analog cosine wave signal;
   g) first analog multiplier means responsive to said analog sine wave signal and said carrier signal for generating a first resolver excitation signal which is a function of both the analog sine wave signal and the carrier signal;
   h) second analog multiplier means responsive to said analog cosine wave signal and said carrier signal for generating a second resolver excitation signal which is a function of both the analog cosine wave signal and the carrier signal;
   i) resolver means for generating a resolver output signal in response to said first and second resolver excitation signals; and,
   j) demodulation means responsive to a resolver output signal and said carrier signal to generate an error signal.

2. The control circuit as recited in claim 1, wherein said first means comprises a first memory means and said second means comprises a second memory means.

3. The control circuit as recited in claim 2, wherein said first memory means comprises a first read only memory means and said second memory means comprises a second read only memory means.

4. The control circuit as recited in claim 1, wherein said counter means operates to increment said counter output signal.

5. The control circuit as recited in claim 1, wherein said counter means operates to decrement said counter output signal.

6. The counter means as recited in claim 4 further responsive to a counter control signal, wherein said counter means operates to increment said counter output signal when said counter control signal is in a first state and said counter means operates to decrement said counter output signal when said counter control signal is in a second state.

7. A control circuit for generating excitation signals for a resolver and recovering an error signal from the resolver, comprising:
   a) periodic clock signal generation means;
   b) frequency divider means responsive to said clock signal for dividing said clock signal into a plurality of divided signals, where one of said divided signals is a carrier signal;
   c) multiplexer means, responsive to a multiplexer control signal, for selecting one of said divided signals as a multiplexer output signal;
   d) counter means responsive to said multiplexer output signal for generating a counter output signal;
   e) first read only memory means responsive to said counter output signal for generating a digital sine wave signal which is a function of said counter output signal;
   f) second read only memory means responsive to said counter output signal for generating a digital cosine wave signal which is a function of said counter output signal;
   g) first digital-to-analog conversion means responsive to said digital sine wave signal for generating an analog sine wave signal;
   h) second digital-to-analog conversion means responsive to said digital cosine wave signal for generating an analog cosine wave signal;
   i) first analog multiplier means responsive to said analog sine wave signal and said carrier signal for generating a first resolver excitation signal which is a function of both the analog sine wave signal and the carrier signal;
   j) second analog multiplier means responsive to said analog cosine wave signal and said carrier signal for generating a second resolver excitation signal which is a function of both the analog cosine wave signal and the carrier signal;
   k) resolver means for generating a resolver output signal in response to said first and second resolver excitation signals;
   l) demodulation means responsive to a resolver output signal and said carrier signal to generate an error signal; and,
   m) motor amplifier means responsive to said error signal for generating a motor drive signal.

8. The control circuit of claim 7, further comprising a signal conditioning means responsive to said frequency divider means for conditioning said carrier signal to produce a conditioned carrier signal.

9. The control circuit of claim 8, wherein the first analog multiplier means, the second analog multiplier means and the demodulation means are each responsive to said conditioned carrier signal.

10. The control circuit of claim 7 wherein said first resolver excitation signal is the sine of the carrier signal multiplied by the sine of the counter output signal.

11. The control circuit of claim 7 wherein said second resolver excitation signal is the sine of the carrier signal multiplied by the cosine of the counter output signal.

12. The control circuit of claim 7 wherein said periodic clock signal generation means includes frequency control means for controlling the clock signal frequency.

13. A control circuit for generating excitation signals for a resolver and recovering an error signal from the resolver, comprising:
   a) periodic digital signal generation means, for generating a first digital signal and a carrier signal, comprising
      i) periodic clock signal generation means;
      ii) frequency divider means responsive to said clock signal for dividing said clock signal into a plurality of divided signals, where one of said divided signal is the carrier signal; and,
      iii) multiplexer means, responsive to a multiplexer control signal, for selecting one of said divided signals as said first digital signal;
   b) counter means responsive to said first digital signal for generating a counter output signal;
   c) first means responsive to said counter output signal for generating a digital sine wave signal which is a function of said counter output signal;
   d) second means responsive to said counter output signal for generating a digital cosine wave signal which is a function of said counter output signal;
   e) first digital-to-analog conversion means responsive to said digital sine wave signal for generating an analog sine wave signal;
   f) second digital-to-analog conversion means responsive to said digital cosine wave signal for generating an analog cosine wave signal;
   g) first analog multiplier means responsive to said analog sine wave signal and said carrier signal for generating a first resolver excitation signal which is a function of both the analog sine wave signal and the carrier signal;
   h) second analog multiplier means responsive to said analog cosine wave signal and said carrier signal for generating a second resolver excitation signal which is a function of both the analog cosine wave signal and the carrier signal;
   i) resolver means for generating a resolver output signal in response to said first and second resolver excitation signals; and
   j) demodulation means responsive to a resolver output signal and said carrier signal to generate an error signal.

14. The control circuit as recited in claim 13, wherein said counter means is further responsive to a switched clock signal for rendering the counter means unresponsive to said first digital signal, where said counter output signal shall remain a fixed value for such period as the switched clock signal remains disabled.

* * * * *